United States Patent
Lin

(10) Patent No.: US 7,382,192 B2
(45) Date of Patent: Jun. 3, 2008

(54) BIAS CURRENT COMPENSATION CIRCUIT FOR A DIFFERENTIAL INPUT STAGE

(75) Inventor: Ching-Tzung Lin, Nantou County (TW)

(73) Assignee: Aimtron Technology Corp., Hsinchu (TW)

( * ) Notice: Subject to any disclaimer, the term of this patent is extended or adjusted under 35 U.S.C. 154(b) by 84 days.

(21) Appl. No.: 11/557,489

(22) Filed: Nov. 7, 2006

(65) Prior Publication Data

US 2008/0106337 A1    May 8, 2008

(51) Int. Cl.
    *H03F 3/45* (2006.01)
(52) U.S. Cl. .................. 330/261; 330/51; 330/136
(58) Field of Classification Search .................. 330/51, 330/136, 252, 253, 261; 327/359
    See application file for complete search history.

(56) References Cited

U.S. PATENT DOCUMENTS

| 4,453,092 A | 6/1984 | Joseph |
| 4,760,286 A | 7/1988 | Pigott |
| 5,128,564 A | 7/1992 | Harvey et al. |
| 6,031,424 A | 2/2000 | Fairgrieve |
| 6,496,067 B1 * | 12/2002 | Behzad et al. .............. 330/261 |
| 6,617,905 B1 | 9/2003 | An et al. |
| 7,012,457 B2 * | 3/2006 | Moran et al. ................ 327/359 |
| 7,068,106 B2 | 6/2006 | Harvey |

* cited by examiner

*Primary Examiner*—Khanh V Nguyen
(74) *Attorney, Agent, or Firm*—Winston Hsu

(57) ABSTRACT

A bias current compensation circuit for a differential input stage has a compensation current supplying circuit and a compensation selecting circuit. The compensation current supplying circuit generates a compensation current. The compensation selecting circuit is coupled between the compensation current supplying circuit and a first and a second input terminals of the differential input stage. When the first input terminal needs to be driven by a first bias current, the compensation selecting circuit determines to allow the compensation current to be applied to the first input terminal for serving as the first bias current. When the second input terminal needs to be driven by a second bias current, the compensation selecting circuit determines to allow the compensation current to be applied to the second input terminal for serving as the second bias current.

13 Claims, 3 Drawing Sheets

BIAS CURRENT COMPENSATION CIRCUIT FOR A DIFFERENTIAL INPUT STAGE

BACKGROUND OF THE INVENTION

1. Field of the Invention

The present invention relates to a bias current compensation circuit and, more particularly, to a bias current compensation circuit applied for a differential input stage.

2. Description of the Related Art

Differential input stages are a well-known elementary electronic building functional block, widely applied in operational amplifiers, analog comparators, and the like. FIG. 1 is a detailed circuit diagram showing a conventional differential input stage 10. The differential input stage 10 is primarily formed by a pair of bipolar junction transistors (BJT) Q1 and Q2. The first transistor Q1 has a base electrode for serving as a first input terminal INa of the differential input stage 10 while the second transistor Q2 has a base electrode for serving as a second input terminal INb of the differential input stage 10. An emitter electrode of the first transistor Q1 and an emitter of the second transistor Q2 are coupled together and further coupled to a lower voltage rail V− through a current source IE1. A collector electrode of the first transistor Q1 is coupled to a higher voltage rail V+ through a resistor R1 while a collector electrode of the second transistor Q2 is coupled to the higher voltage rail V+ through a resistor R2. Moreover, a first output terminal OUTa of the differential input stage 10 is implemented by the collector electrode of the first transistor Q1 while a second output terminal OUTb of the differential input stage 10 is implemented by the collector electrode of the second transistor Q2.

As shown in FIG. 1, in a typical application of the operational amplifier or analog comparator, the first and the second input terminals INa and INb of the differential input stage 10 receive two independent voltage signals from a signal drive circuit 11, respectively. One of the two voltage signals may be a variable drive signal and the other may be a constant reference signal, or both of them are variable drive signals. In response to a difference between the first and the second voltage signals at the first and the second input terminals INa and INb, the first and second output terminals OUTa and OUTb generates an amplified signal or a compared result to be supplied to an output application circuit 12.

During the amplifying or comparing operation performed by the differential input stage 10, the first and the second transistors Q1 and Q2 need to be turned on or off in accordance with the first and the second voltage signals received at the first and the second input terminals INa and INb. For example, when the first voltage signal received at the first input terminal INa is higher than the second voltage signal received at the second input terminal INb, the first transistor Q1 needs to be turned on by a first bias current IBa such that the current source IE1 flows through the conductive first transistor Q1. When the second voltage signal received at the second input terminal INb is higher than the first voltage signal received at the first input terminal INa, the second transistor Q2 needs to be turned on by a second bias current IBb such that the current source IE1 flows through the conductive second transistor Q2.

As to the conventional application shown in FIG. 1, the first and the second bias currents IBa and IBb must be provided by the signal drive circuit 11. Since the demand of the first bias current IBa and the demand of the second bias current IBb do not occur simultaneously, the signal drive circuit 11 induces a voltage error between the first and the second input terminals INa and INb. Furthermore, due to the trend of developing a higher responsive speed of the differential input stage 10, the signal drive circuit 11 is required to provide a much higher bias current IBa or IBb. However, a larger error and a nonlinear effect are inevitably caused by the signal drive circuit 11 due to the burden of providing the much higher bias current IBa or IBb, resulting in that the differential input stage 10 fails to achieve accurate operations.

SUMMARY OF THE INVENTION

In view of the above-mentioned problems, an object of the present invention is to provide a bias current compensation circuit for a differential input stage, which is capable of providing a compensation current to input terminals of the differential input stage for serving as the required bias current. Therefore, it is unnecessary for the signal drive circuit to provide the bias current and an accurate operation of the differential input stage is achieved according to the present invention.

According to a first aspect of the present invention, a bias current compensation circuit is provided to be applied for a differential input stage. The bias current compensation circuit includes a compensation current supplying circuit and a compensation selecting circuit. The compensation current supplying circuit generates a compensation current. The compensation selecting circuit is coupled between the compensation current supplying circuit and a first and a second input terminals of the differential input stage. When a first voltage signal at the first input terminal is higher than a second voltage signal at the second input terminal, the compensation selecting circuit determines to allow the compensation current to be supplied to the first input terminal. When the second voltage signal is higher than the first voltage signal, the compensation selecting circuit determines to allow the compensation current to be supplied to the second input terminal.

According to a second aspect of the present invention, a bias current compensation circuit is provided to be applied for a differential input stage. The bias current compensation circuit includes a compensation current supplying circuit and a compensation selecting circuit. The compensation current supplying circuit generates a compensation current. The compensation selecting circuit is coupled between the compensation current supplying circuit and a first and a second input terminals of the differential input stage. The compensation selecting circuit includes a first switch, a second switch, and a comparing control unit. The first switch is coupled between the compensation current supplying circuit and the first input terminal, such that the compensation current is allowed to be supplied to the first input terminal when the first switch is turned on. The second switch is coupled between the compensation current supplying circuit and the second input terminal, such that the compensation current is allowed to be supplied to the second input terminal when the second switch is turned on. The comparing control unit controls the first switch and the second switch in response to a comparison between a first voltage signal at the first input terminal and a second voltage signal at the second input terminal, such that the first switch and the second switch are prevented from being turned on simultaneously.

According to a third aspect of the present invention, a bias current compensation circuit is provided to be applied for a differential input stage. The bias current compensation circuit includes a compensation current supplying circuit and a compensation selecting circuit. The compensation current supplying circuit generates a compensation current. The compensation selecting circuit is coupled between the compensation current supplying circuit and a first and a second input terminals of the differential input stage. When the first input terminal needs to be driven by a first bias current, the compensation selecting circuit determines to allow the compensation current to be applied to the first input terminal for serving as the first bias current. When the second input terminal needs to be driven by a second bias current, the compensation selecting circuit determines to allow the compensation current to be applied to the second input terminal for serving as the second bias current.

BRIEF DESCRIPTION OF THE DRAWINGS

The above-mentioned and other objects, features, and advantages of the present invention will become apparent with reference to the following descriptions and accompanying drawings, wherein.

DETAILED DESCRIPTION OF THE PREFERRED EMBODIMENTS

The preferred embodiments according to the present invention will be described in detail with reference to the drawings.

Figure 1:
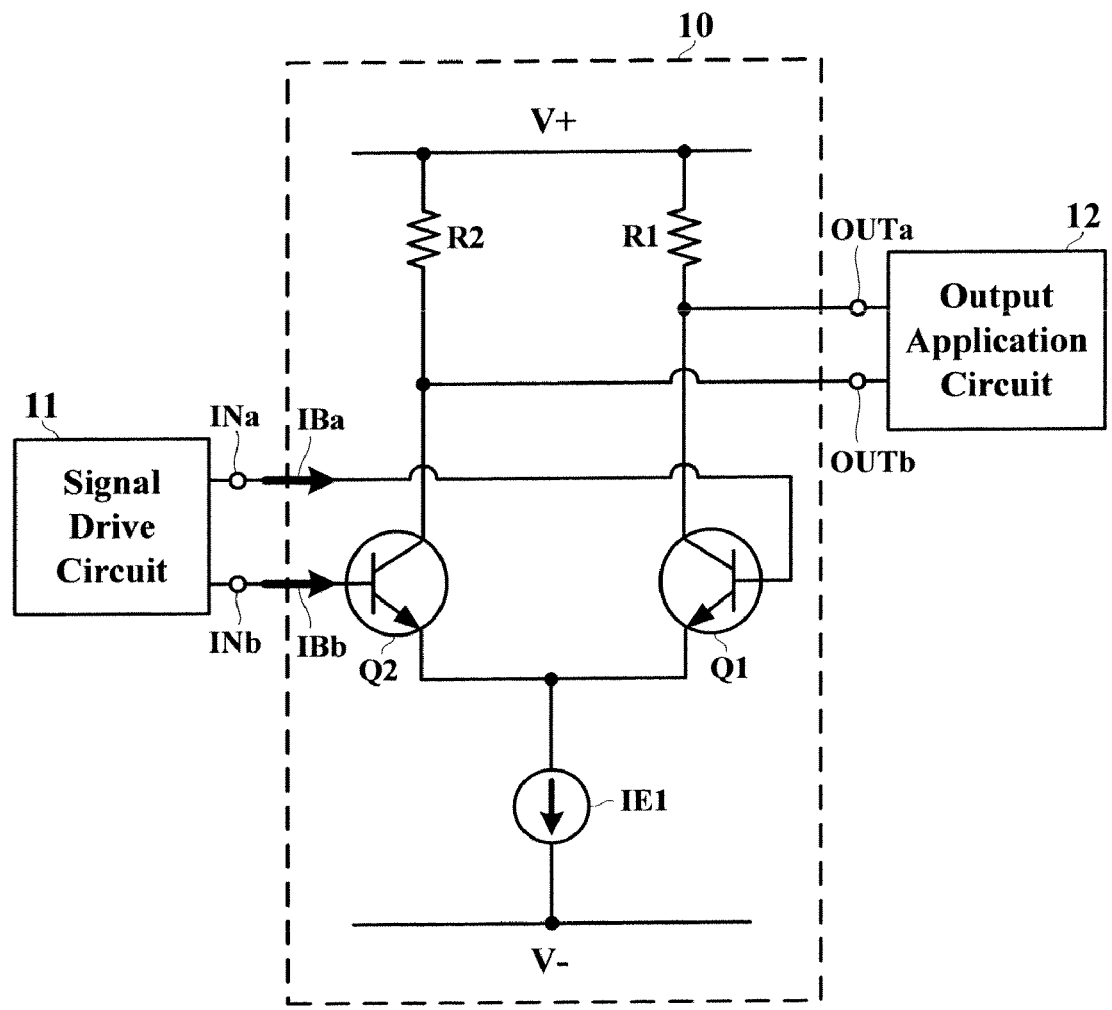
FIG. 1 is a detailed circuit diagram showing a conventional differential input stage.
Figure 2:
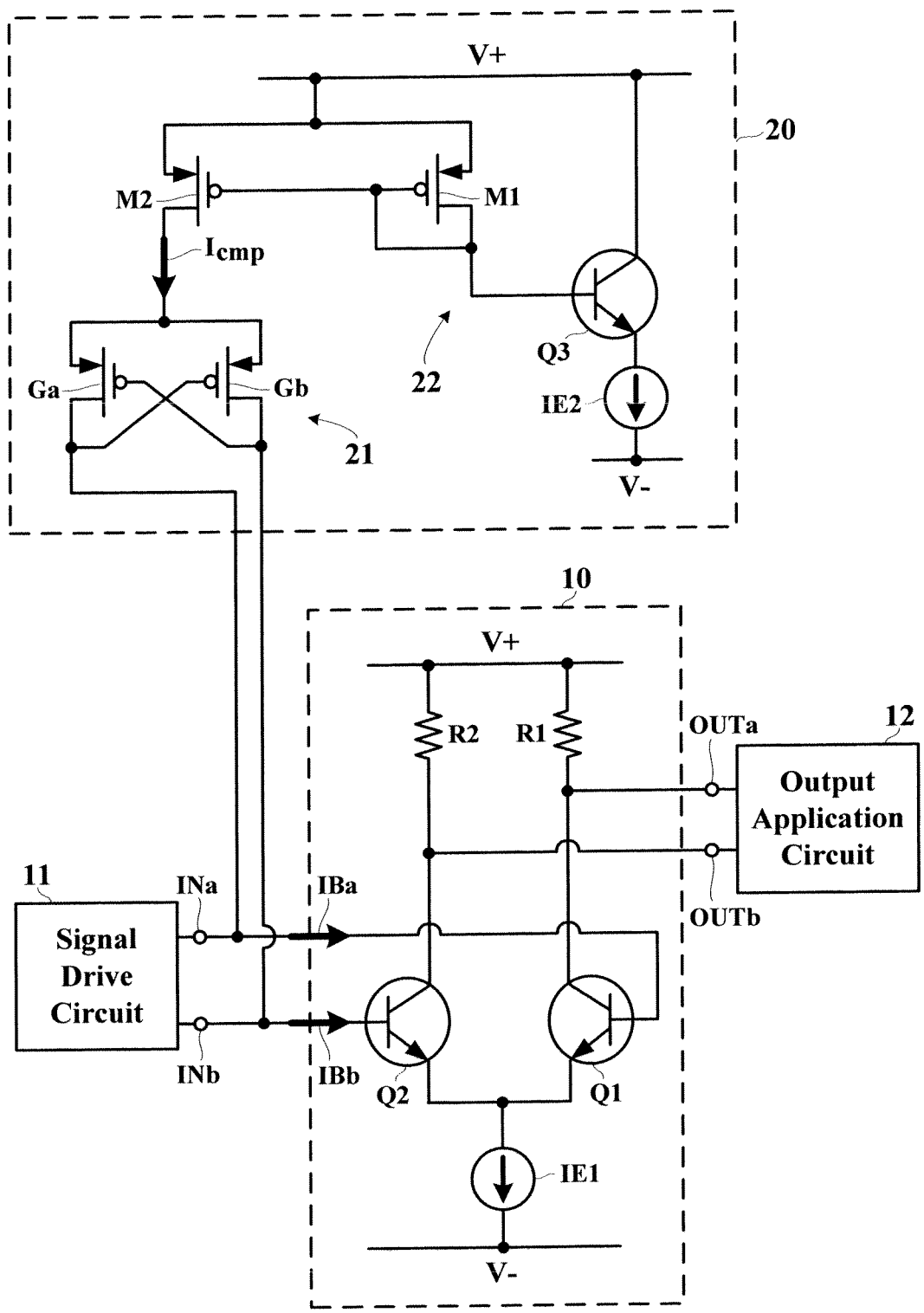
FIG. 2 is a detailed circuit diagram showing a bias current compensation circuit according to a first embodiment of the present invention.

FIG. 2 is a detailed circuit diagram showing a bias current compensation circuit 20 according to a first embodiment of the present invention. The bias current compensation circuit 20 is coupled to the first and the second input terminals INa and INb of the differential input stage 10, for selectively supplying a compensation current $I_{cmp}$ to either the first input terminal INa or the second input terminal INb. More specifically, the bias current compensation circuit 20 primarily includes a compensation selecting circuit 21 and a compensation current supplying circuit 22. The compensation selecting circuit 21 is coupled between the first and the second input terminals INa and INb of the differential input stage 10 and the compensation current supplying circuit 22. Based on a comparison between the first and the second voltage signals received at the first and the second input terminals INa and INb from the signal drive circuit 11, the compensation selecting circuit 21 determines to apply the compensation current $I_{cmp}$ provided by the compensation current supplying circuit 22 to either the first input terminal INa or the second input terminal INb. In other words, when the first voltage signal received at the first input terminal INa is higher than the second voltage signal received at the second input terminal INb, the compensation selecting circuit 21 determines to apply the compensation current $I_{cmp}$ to the first input terminal INa for serving as the first bias current IBa so as to turn on the first transistor Q1. When the second voltage signal received at the second input terminal INb is higher than the first voltage signal received at the first input terminal INa, the compensation selecting circuit 21 determines to apply the compensation current $I_{cmp}$ to the second input terminal INb for serving as the second bias current IBb so as to turn on the second transistor Q2.

In the first embodiment shown in FIG. 2, the compensation selecting circuit 21 is formed by a first control unit Ga and a second control unit Gb. The first control unit Ga has a first control electrode and a first current path, which is turned on or off through the first control electrode. The second control unit Gb has a second control electrode and a second current path, which is turned on or off through the second control electrode.

More specifically, the first control unit Ga may be implemented by a first PMOS transistor, in which the first control electrode is implemented by a gate electrode of the first PMOS transistor and the first current path is implemented by a channel between a drain electrode and a source electrode of the first PMOS transistor. The second control unit Gb may be implemented by a second PMOS transistor, in which the second control electrode is implemented by a gate electrode of the second PMOS transistor and the second current path is implemented by a channel between a drain electrode and a source electrode of the second PMOS transistor. The gate electrode of the first PMOS transistor Ga is coupled to the drain electrode of the second PMOS transistor Gb while the gate electrode of the second PMOS transistor Gb is coupled to the drain electrode of the first PMOS transistor Ga. The drain electrode of the first PMOS transistor Ga is coupled to the first input terminal INa while the drain electrode of the second PMOS transistor Gb is coupled to the second input terminal INb. The source electrode of the first PMOS transistor Ga and the source electrode of the second PMOS transistor Gb are coupled together for receiving the compensation current $I_{cmp}$ provided by the compensation current supplying circuit 22.

When the first voltage signal at the first input terminal INa is higher than the second voltage signal at the second input terminal INb, the first PMOS transistor Ga is turned on and the second PMOS transistor Gb is turned off. As a result, the compensation current $I_{cmp}$ is allowed to be supplied to the first input terminal INa through the conductive first PMOS transistor Ga. When the second voltage signal at the second input terminal INb is higher than the first voltage signal at the first input terminal INa, the first PMOS transistor Ga is turned off and the second PMOS transistor Gb is turned on. As a result, the compensation current $I_{cmp}$ is allowed to be supplied to the second input terminal INb through the conductive second PMOS transistor Gb.

In the first embodiment shown in FIG. 2, the compensation current supplying circuit 22 has a duplicate current source IE2, a duplicate transistor Q3, and a current mirror formed by a pair of PMOS transistors Ma and Mb. More specifically, the duplicate transistor Q3 has a source electrode coupled to a lower voltage rail V− through the duplicate current source IE2, a drain electrode coupled to a higher voltage rail V+, and a base electrode coupled to the current mirror formed by the PMOS transistors Ma and Mb. The duplicate current source IE2 is designed to be substantially identical to the current source IE1 of the differential input stage 10, and the duplicate transistor Q3 is designed to be substantially identical to the transistor Q1 or Q2 (typically, the transistor Q1 is matching with the transistor Q2). Therefore, a current is generated to flow through the base electrode of the duplicate transistor Q3, which is substantially equal to the bias current IBa or IBb required to turn on the transistor Q11 or Q2. Through the transfer of the current mirror formed by the PMOS transistors Ma and Mb, the current flowing through the base electrode of the duplicate transistor Q3 is correspondingly transformed to become the compensation current $I_{cmp}$.

It should be noted that in the compensation selecting circuit 21 of the first embodiment, the first and the second control units Ga and Gb may be implemented by two identical PNP-type bipolar junction transistor being cross-coupled together. In this case, the base electrode of the PNP-type bipolar junction transistor serves as the control electrode of the control unit, and the channel between the collector electrode and the emitter electrode serves as the current path of the control unit.

It should be noted that the bias current compensation circuit according to the present invention may be applied to various types of differential input stage, such as PNP-type bipolar junction transistor (BJT), metal-oxide-semiconductor field effect transistor (MOSFET), or junction field effect transistor (JFET).

Figure 3:
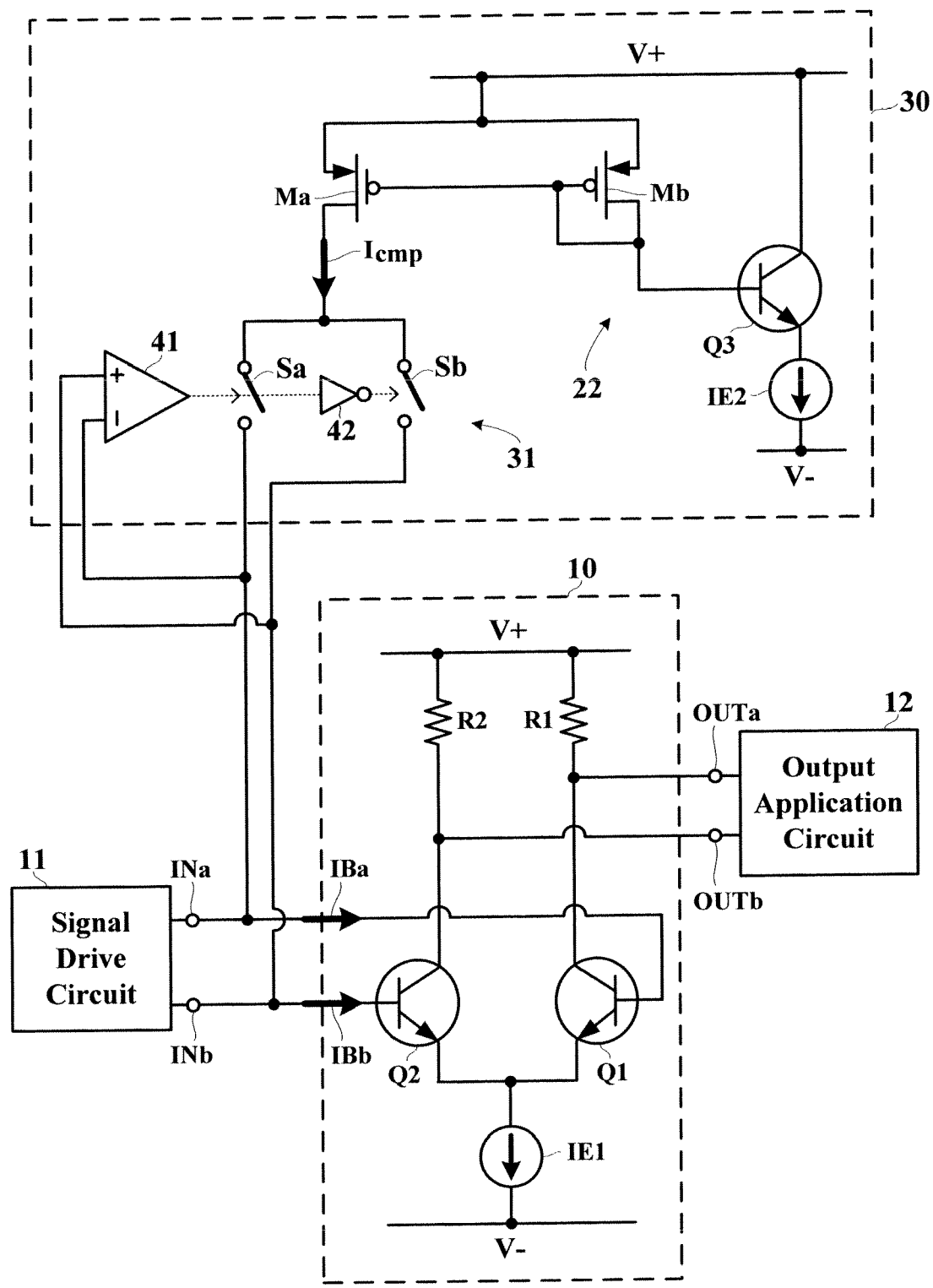
FIG. 3 is a detailed circuit diagram showing a bias current compensation circuit according to a second embodiment of the present invention.

FIG. 3 is a detailed circuit diagram showing a bias current compensation circuit 30 according to a second embodiment of the present invention. The bias current compensation circuit 30 of the second embodiment is different from the bias current compensation circuit 20 in that a compensation selecting circuit 31 of the second-embodiment bias current compensation circuit 30 includes a first switch Sa, a second switch Sb, and a comparing control unit 41, 42. The first switch Sa is coupled between the compensation current supplying circuit 22 and the first input terminal INa, such that the compensation current $I_{cmp}$ is allowed to be supplied to the first input terminal INa when the first switch Sa is turned on. The second switch Sb is coupled between the compensation current supplying circuit 22 and the second input terminal INb, such that the compensation current $I_{cmp}$ is allowed to be supplied to the second input terminal INb when the second switch Sb is turned on. Based on a comparison between the first and the second voltage signals, the comparing control unit 41, 42 controls the first and the second switches Sa and Sb, such that the first and the second switches Sa and Sb are prevented from being turned on simultaneously.

In the second embodiment shown in FIG. 3, the comparing control unit is formed by a voltage comparator 41 and an inverter 42. The voltage comparator 41 has a non-inverting input terminal, coupled to the first input terminal INa of the differential input stage 10, and an inverting input terminal, coupled to the second input terminal INb of the differential input stage 10. The output terminal of the voltage comparator 41 directly controls the first switch Sa and indirectly controls the second switch Sb through the inverter 42. When the first voltage signal at the first input terminal INa is higher than the second voltage signal at the second input terminal INb, the voltage comparator 41 turns on the first switch Sa and turns off the second switch Sb. As a result, the compensation current $I_{cmp}$ is allowed to be supplied to the first input terminal INa through the conductive first switch Sa. When the second voltage signal at the second input terminal INb is higher than the first voltage signal at the first input terminal INa, the voltage comparator 41 turns off the first switch Sa and turns on the second switch Sb. As a result, the compensation current $I_{cmp}$ is allowed to be supplied to the second input terminal INb through the conductive second switch Sb.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A bias current compensation circuit for a differential input stage, comprising:
    a compensation current supplying circuit for generating a compensation current, and
    a compensation selecting circuit coupled between the compensation current supplying circuit and a first and a second input terminals of the differential input stage, wherein:
    when a first voltage signal at the first input terminal is higher than a second voltage signal at the second input terminal, the compensation selecting circuit determines to allow the compensation current to be supplied to the first input terminal, and
    when the second voltage signal is higher than the first voltage signal, the compensation selecting circuit determines to allow the compensation current to be supplied to the second input terminal.

2. The circuit according to claim 1, wherein:
    the compensation selecting circuit comprises:
    a first control unit having a first control electrode and a first current path, the first control electrode coupled to the second input terminal for controlling the first current path in response to the second voltage signal, the first current path coupled between the compensation current supplying circuit and the first input terminal, such that the compensation current is allowed to be supplied to the first input terminal when the second voltage signal turns on the first current path through the first control electrode, and
    a second control unit having a second control electrode and a second current path, the second control electrode coupled to the first input terminal for controlling the second current path in response to the first voltage signal, the second current path coupled between the compensation current supplying circuit and the second input terminal, such that the compensation current is allowed to be supplied to the second input terminal when the first voltage signal turns on the second current path through the second control electrode.

3. The circuit according to claim 2, wherein:
    the first control unit is implemented by a first PMOS transistor such that the first control electrode is implemented by a gate electrode of the first PMOS transistor, and the first current path is implemented by a channel between a drain electrode and a source electrode of the first PMOS transistor, and
    the second control unit is implemented by a second PMOS transistor such that the second control electrode is implemented by a gate electrode of the second PMOS transistor, and the second current path is implemented by a channel between a drain electrode and a source electrode of the second PMOS transistor.

4. The circuit according to claim 1, wherein:
    the differential input stage comprises:
    a current source coupled to a lower voltage rail;
    a first transistor having a base electrode, an emitter electrode, and a collector electrode, the base electrode of the first transistor serving as the first input terminal, the emitter electrode of the first transistor coupled to the current source, the collector electrode of the first transistor coupled to a higher voltage rail; and a second transistor having a base electrode, an emitter electrode, and a collector electrode, the base electrode of the second transistor serving as the second input terminal, the emitter electrode of the second transistor coupled to the current source, the collector electrode of the second transistor coupled to the higher voltage rail.

5. The circuit according to claim 4, wherein:
the compensation current supplying circuit comprises:
   a duplicate current source being designed identically to the current source of the differential input stage;
   a duplicate transistor being designed identically to the first transistor of the differential input stage, an emitter electrode of the duplicate transistor coupled to the duplicate current source, a collector electrode of the duplicate transistor coupled to the higher voltage rail; and
   a current mirror coupled to a base electrode of the duplicate transistor for generating the compensation current in response to a current flowing through the base electrode of the duplicate transistor.

6. A bias current compensation circuit for a differential input stage, comprising:
   a compensation current supplying circuit for generating a compensation current, and
   a compensation selecting circuit coupled between the compensation current supplying circuit and a first and a second input terminals of the differential input stage, wherein:
   the compensation selecting circuit comprises:
      a first switch coupled between the compensation current supplying circuit and the first input terminal, such that the compensation current is allowed to be supplied to the first input terminal when the first switch is turned on;
      a second switch coupled between the compensation current supplying circuit and the second input terminal, such that the compensation current is allowed to be supplied to the second input terminal when the second switch is turned on; and
      a comparing control unit for controlling the first switch and the second switch in response to a comparison between a first voltage signal at the first input terminal and a second voltage signal at the second input terminal, such that the first switch and the second switch are prevented from being turned on simultaneously.

7. The circuit according to claim 6, wherein:
the comparing control unit is implemented by a voltage comparator and an inverter, the voltage comparator having a first input terminal, a second input terminal, and an output terminal, the first input terminal of the comparing control unit coupled to the first input terminal of the differential input stage, the second input terminal of the comparing control unit coupled to the second input terminal of the differential input stage, the output terminal directly controlling the first switch and indirectly controlling the second switch through the inverter.

8. The circuit according to claim 6, wherein:
when a first voltage signal at the first input terminal is higher than a second voltage signal at the second input terminal, the comparing control unit turns on the first switch, and
when the second voltage signal is higher than the first voltage signal, the comparing control unit turns on the second switch.

9. The circuit according to claim 6, wherein:
the differential input stage comprises:
   a current source coupled to a lower voltage rail;
   a first transistor having a base electrode, an emitter electrode, and a collector electrode, the base electrode of the first transistor serving as the first input terminal, the emitter electrode of the first transistor coupled to the current source, the collector electrode of the first transistor coupled to a higher voltage rail; and
   a second transistor having a base electrode, an emitter electrode, and a collector electrode, the base electrode of the second transistor serving as the second input terminal, the emitter electrode of the second transistor coupled to the current source, the collector electrode of the second transistor coupled to the higher voltage rail.

10. The circuit according to claim 9, wherein:
the compensation current supplying circuit comprises:
   a duplicate current source being designed identically to the current source of the differential input stage;
   a duplicate transistor being designed identically to the first transistor of the differential input stage, an emitter electrode of the duplicate transistor coupled to the duplicate current source, a collector electrode of the duplicate transistor coupled to the higher voltage rail; and
   a current mirror coupled to a base electrode of the duplicate transistor for generating the compensation current in response to a current flowing through the base electrode of the duplicate transistor.

11. A bias current compensation circuit for a differential input stage, comprising:
   a compensation current supplying circuit for generating a compensation current, and
   a compensation selecting circuit coupled between the compensation current supplying circuit and a first and a second input terminals of the differential input stage, wherein:
   when the first input terminal needs to be driven by a first bias current, the compensation selecting circuit determines to allow the compensation current to be applied to the first input terminal for serving as the first bias current, and
   when the second input terminal needs to be driven by a second bias current, the compensation selecting circuit determines to allow the compensation current to be applied to the second input terminal for serving as the second bias current.

12. The circuit according to claim 11, wherein:
the compensation selecting circuit comprises:
   a first control unit having a first control electrode and a first current path, the first control electrode coupled to the second input terminal for controlling the first current path in response to a second voltage signal at the second input terminal, the first current path coupled between the compensation current supplying circuit and the first input terminal, such that the compensation current is allowed to be supplied to the first input terminal when the second voltage signal turns on the first current path through the first control electrode, and
   a second control unit having a second control electrode and a second current path, the second control electrode coupled to the first input terminal for controlling the second current path in response to a first voltage signal at the first input terminal, the second current path coupled between the compensation current supplying circuit and the second input terminal, such that the compensation current is allowed to be supplied to the second input terminal when the first voltage signal turns on the second current path through the second control electrode.

13. The circuit according to claim 11, wherein:
the compensation selecting circuit comprises:
- a first switch coupled between the compensation current supplying circuit and the first input terminal, such that the compensation current is allowed to be supplied to the first input terminal when the first switch is turned on;
- a second switch coupled between the compensation current supplying circuit and the second input terminal, such that the compensation current is allowed to be supplied to the second input terminal when the second switch is turned on; and
- a comparing control unit for controlling the first switch and the second switch in response to a comparison between a first voltage signal at the first input terminal and a second voltage signal at the second input terminal, such that the first switch and the second switch are prevented from being turned on simultaneously.

* * * * *